United States Patent
Song et al.

(10) Patent No.: US 9,893,728 B2
(45) Date of Patent: Feb. 13, 2018

(54) WIDEBAND HIGHLY-LINEAR LOW OUTPUT IMPEDANCE D2S BUFFER CIRCUIT

(71) Applicant: MEDIATEK INC., Hsin-Chu (TW)

(72) Inventors: Fei Song, San Jose, CA (US); Osama Shana'a, Los Altos, CA (US); Yuen Hui Chee, San Jose, CA (US)

(73) Assignee: MEDIATEK INC., Hsin-Chu (TW)

( * ) Notice: Subject to any disclaimer, the term of this patent is extended or adjusted under 35 U.S.C. 154(b) by 1 day.

(21) Appl. No.: 14/862,520

(22) Filed: Sep. 23, 2015

(65) Prior Publication Data

US 2016/0365859 A1   Dec. 15, 2016

Related U.S. Application Data

(60) Provisional application No. 62/172,815, filed on Jun. 9, 2015.

(51) Int. Cl.
*H03B 1/00* (2006.01)
*H03K 19/0185* (2006.01)
(Continued)

(52) U.S. Cl.
CPC ..... *H03K 19/018514* (2013.01); *H03F 3/195* (2013.01); *H03F 3/3028* (2013.01);
(Continued)

(58) Field of Classification Search
None
See application file for complete search history.

(56) References Cited

U.S. PATENT DOCUMENTS

| 7,405,624 B2 * | 7/2008 | Franck | H03F 3/505 330/264 |
| 2010/0109779 A1 * | 5/2010 | Pham | H03F 1/086 330/296 |

(Continued)

FOREIGN PATENT DOCUMENTS

KR    100951583 B1    10/2008

OTHER PUBLICATIONS

Donggu Im et el., "A CMOS Resistive Feedback Differential Low-Noise Amplifier With Enhanced Loop Gain for Digital TV Tuner Applications", IEEE Transactions on Microwave Theory and Techniques, vol. 57, No. 11, pp. 2633-2642 (Nov. 2009).

(Continued)

*Primary Examiner* — Cassandra Cox
(74) *Attorney, Agent, or Firm* — Imperium Patent Works; Thomas Wallace; Zheng Jin

(57) ABSTRACT

A wideband highly-linear buffer circuit exhibiting a low output impedance comprises a first PFET (PFET1), a second PFET (PFET2), a first NFET (NFET1), and a second NFET (NFET2). Sources of PFET1 and PFET2 are coupled to VDD. PFET1's drain is coupled to an output lead. PFET2 acts as a current source. NFET1's drain is coupled to PFET2's drain and to PFET1's gate. NFET1's source is coupled to the output lead. NFET2's source is coupled to ground. NFET2's drain is coupled to NFET1's source and to the output lead. NFET1's gate is AC coupled to a first input lead. In a single-ended input example, NFET2's gate is AC coupled NFET1's drain. In a differential input example, NFET2's gate is AC coupled to a second input lead. In another differential input example, PFET2 is not just a current source, but rather PFET2's gate is AC coupled to the first input lead.

18 Claims, 10 Drawing Sheets

(51) Int. Cl.
  *H03F 3/195* (2006.01)
  *H03F 3/45* (2006.01)
  *H03F 3/50* (2006.01)
  *H04B 1/40* (2015.01)
  *H03F 3/30* (2006.01)
  *H04B 1/04* (2006.01)

(52) U.S. Cl.
  CPC ......... *H03F 3/3033* (2013.01); *H03F 3/3037* (2013.01); *H03F 3/45201* (2013.01); *H03F 3/45475* (2013.01); *H03F 3/505* (2013.01); *H04B 1/40* (2013.01); *H03F 3/3001* (2013.01); *H03F 2200/21* (2013.01); *H03F 2200/42* (2013.01); *H03F 2200/451* (2013.01); *H03F 2200/498* (2013.01); *H03F 2200/69* (2013.01); *H03F 2200/75* (2013.01); *H03F 2203/45136* (2013.01); *H03F 2203/45168* (2013.01); *H03F 2203/45224* (2013.01); *H03F 2203/45258* (2013.01); *H03F 2203/45301* (2013.01); *H03F 2203/45496* (2013.01); *H03F 2203/45544* (2013.01); *H03F 2203/45596* (2013.01); *H03F 2203/45656* (2013.01); *H03F 2203/45674* (2013.01); *H04B 2001/0425* (2013.01)

(56) References Cited

U.S. PATENT DOCUMENTS

2014/0232465 A1* 8/2014 Yan ..................... H03F 3/45192
                                                    330/260

2015/0220094 A1* 8/2015 Ho ........................... G05F 1/575
                                                    323/280

OTHER PUBLICATIONS

In-Young Lee et al., "A Fully Integrated TV Tuner Front-End with 3.1dB NF, >+31 dBm OIP3, >83dB HRR3/5 and >68dB HRR7", 2014 IEEE International Solid State Circuits Conference, Session 3, RF Techniques, 3.7, pp. 70-72 (Feb. 10, 2014).

Gray et al., "Analysis and Design of Analog Integrated Circuits", Fourth Edition, John Wiley & Sons, Inc., cover page and two following pages, pp. 195-197, and pp. 213-215 (copyright 2001).

EPO, Search Report for the EP patent application 15191028.8 dated Nov. 3, 2016 (19 pages).

Jing-Hong Conan Zhan et al., An Inductor-Less Broadband LNA with Gain Step, pp. 344-347, p. 345, *paragraph II.C, figure 3*.

Skawrat Wangtaphan et al., A 0.6 Volt Class-AB CMOS Voltage Follower with Bulk-Driven Quasi-floating Gate Super Source Follower, pp. 1-4, *paragraph [00II], figure 3*.

Yasutaka Haga et al., 0.8-Volt Bulk-Driven Flipped Voltage Follower, pp. 1-4, *paragraph [00II], figure 2(b)*.

Antonio J. Lopez-Martin et al., Micropower Class AB Voltage Followers with Simple Quiescent Current Control, pp. 218-221 *p. 219, paragraph III, figure 2(d)*.

Peng Zhang et al., Class-AB CMOS buffer with floating class-AB control, pp. 120-123, *paragraph [0001], figure 2*.

Donggu Im et al, A Broadband CMOS RF Front-End for Universal Tuners Supporting Multi-Standard Terrestrial and Cable Broadcasts, pp. 392-406, *p. 400, paragraph II.C, figure 13(a)*.

* cited by examiner

COMMON DRAIN
SOURCE FOLLOWER

SUPER SOURCE FOLLOWER

DIFFERENTIAL SOURCE FOLLOWER
(DSF)

DIFFERENTIAL HYBRID VOLTAGE
BUFFER (DHVB)

MORE DETAILED VIEW OF THE "WIDEBAND HIGHLY-LINEAR D2S AND BUFFER CIRCUIT" IN THE RF TRANSCEIVER

MORE DETAILED CIRCUIT DIAGRAM OF THE D2S CIRCUIT $$\frac{V_{out}}{V_{in}} = \frac{g_{m9}[1+(g_{m10}+g_{m11})r_{o12}]}{\frac{1}{R_L}+g_{m9}[1+(g_{m10}+g_{m11})r_{o12}]}$$
FIG. 9
$$r_{out} = \frac{1}{g_{m9}[1+(g_{m10}+g_{m11})r_{o12}]}$$
FIG. 10
$$\frac{V_{INT}}{V_{in}} = -\frac{g_{m9}}{1+g_{m9}\beta R_L}r_{o12}$$
FIG. 11
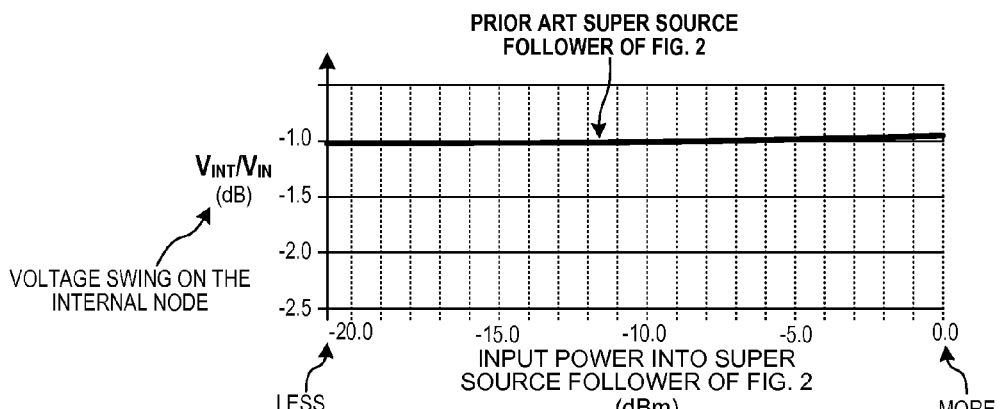
FIG. 12
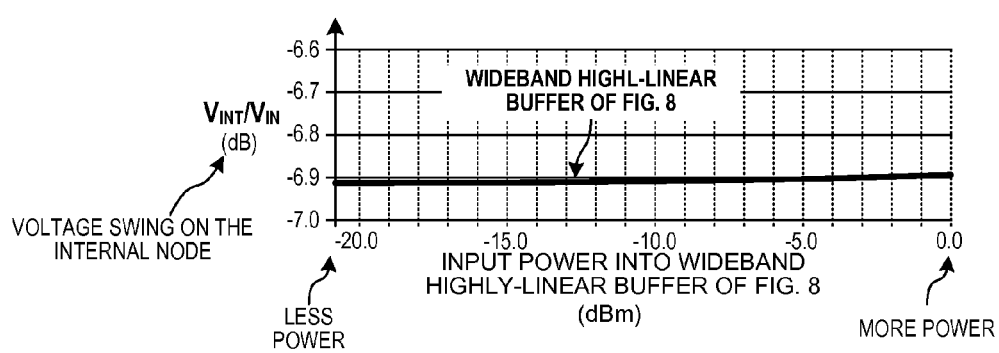
FIG. 13

WIDEBAND HIGHLY-LINEAR BUFFER CIRCUIT

RF TRANSCEIVER

WIDEBAND HIGHLY-LINEAR LOW OUTPUT IMPEDANCE D2S BUFFER CIRCUIT

CROSS REFERENCE TO RELATED APPLICATION

This application claims the benefit under 35 U.S.C. 119 from provisional U.S. patent application Ser. No. 62/172,815, filed on Jun. 9, 2015. This application incorporates by reference the entire contents of provisional U.S. patent application Ser. No. 62/172,815.

TECHNICAL FIELD

The described embodiments relate to wideband highly-linear buffer circuits, to transceivers that include such buffer circuits in their predistortion lookback circuitry, and to related structures and methods.

BACKGROUND INFORMATION

Some applications of a buffer circuit involve receiving a differential input signal, conveying the signal and thereby generating a single-ended output signal, and driving the single-ended output signal to a low impedance load. Operation of the buffer circuit is to be highly linear. The buffer is to convey the signal confidently without contributing any significant distortion component over a wide input power range. Various different buffer circuits, and combinations of amplifier circuits, may be employed in an attempt to realize an overall buffer that has the desired characteristics and performance.

FIG. 1 (Prior Art) is a circuit diagram of one type of circuit that can be employed to realize the buffer. The circuit 1 is a common drain circuit 1 (also called a source follower). Circuit 1 is appropriate for driving a low impedance load because the circuit has a low output impedance, a high input impedance, and a large current gain. The output impedance is approximately equal to $1/g_m$, where $g_m$ is the transconductance of field effect transistor 2. The output voltage signal is developed across the current source 3 load. The circuit, however, only receives a single-ended signal. Accordingly, if this circuit is to be employed in an application as mentioned above where the input signal is a differential input signal, then another preceding stage is employed to receive the differential input signal, and to convert that differential signal into a single-ended signal $V_{IN}$ that can then be supplied onto the input lead 4 of the source follower circuit 1. The source follower circuit 1 in turn supplies a single-ended output signal $V_{OUT}$ via its output lead 5 to the low impedance load.

FIG. 2 (Prior Art) is a circuit diagram of a modified source follower circuit 6 that has even a lower output impedance. The circuit 6 of FIG. 2 is called a super source follower. As in the case of the source follower circuit 1 of FIG. 1, the first transistor 7 is in the common drain configuration. Capacitor 8 and resistor 9 are a biasing circuit. The AC component of the input signal $V_{IN}$ on input lead 10 is AC coupled by the capacitor 8 onto the gate of the first transistor 7. Resistor 9 allows the gate of the first transistor 7 to be DC biased to a first voltage $V_{BIAS1}$. Transistor 11 functions as a current source in much the same way as current source 3 operates in the source follower circuit 1 of FIG. 1. The super source follower circuit of FIG. 2, as compared to the source follower circuit 1 of FIG. 1, includes an additional P-channel field effect transistor 12, that acts as a current source, and an additional P-channel field effect transistor 13. These components reduce the output impedance of the overall circuit to approximately $1/(g_{m1}*(1+g_{m2}*r_{o12}))$, where $g_{m1}$ is the transconductance of transistor 7, where $g_{m2}$ is the transconductance of transistor 13, and where $r_{o12}$ is the output impedance of transistor 12. As in the case of the conventional source follower circuit of FIG. 1, if the super source follower circuit 6 of FIG. 2 is used, then a preceding differential to single-ended (D2S) circuit may be employed to supply a single-ended signal onto the input lead 10 of the super source follower circuit 6. The super source follower circuit 6 supplies a single-ended output signal via its output lead 14 to the low impedance load.

FIG. 3 (Prior Art) is a diagram of another buffer circuit 15 that might be considered for use in receiving a differential input signal and outputting a single-ended signal to a low impedance load. Rather than receiving a differential input signal onto a first stage that outputs a single-ended signal so that a second stage source follower or super source follower can receive a single-ended input signal, the circuit 15 of FIG. 3 can receive the differential input signal directly onto input terminals 16 and 17. The circuit 15 of FIG. 3 outputs a differential output signal onto output terminals 18 and 19. The differential input signal is received by N-channel field effect transistors 20 and 21. N-channel field effect transistor 22 operates as a current source load for signal N-channel transistor 20. N-channel field effect transistor 23 operates as a current source load for signal N-channel transistor 21. The circuit 15 of FIG. 3, however, outputs a differential signal. If the circuit of FIG. 3 were to be used in the application mentioned above where a single-ended output signal is needed, then a second D2S stage may be employed to convert the differential output signal from the circuit 15 into the single-ended signal required to drive the low impedance load. This second stage, however, would consume additional power. Moreover, the second stage may not have an adequately low output impedance to drive the low impedance load with adequate linearity. Yet a third stage may therefore be required in order to drive the low impedance load without undue loss of buffer linearity. The circuit of FIG. 3 is therefore not really suitable for driving a single-ended signal onto a low impedance load, where the buffer is to be highly linear over a wide range of output power levels.

FIG. 4 (Prior Art) is a diagram of an improved version of the circuit of FIG. 3. The circuit 24 of FIG. 4 is referred to here as a differential hybrid voltage buffer or "DHVB". A differential input signal is received onto input leads 25 and 26. The circuit generates a differential output signal that is output via output leads 27 and 28. The $V_{IN+}$ component of the input signal is not just received onto the gate of N-channel signal transistor 29 as in the case of FIG. 3, but rather the $V_{IN+}$ component is of appropriate phase that it can control the N-channel transistor 30 in a signal amplification function. Transistor 30 is therefore not just used as a current source load as in the circuit of FIG. 3, but rather transistor 30 is used for signal amplification. Likewise, the $V_{IN-}$ component of the input signal is not just received onto the N-channel signal transistor 31 as in the case of FIG. 3, but rather the $V_{IN-}$ component of the input signal is of appropriate phase that it is made to control the N-channel transistor 32. The N-channel transistor 32 does not just operate as current source load as in the case of FIG. 3, but rather in the case of FIG. 4 the N-channel transistor 32 operates as an amplifier and contributes to the output signal. The N-channel transistors 29 and 31 are in the common drain configuration. The N-channel transistors 30 and 32 are in the common source configuration. Because the buffer circuit of FIG. 4 is a mix of two circuit topologies, the circuit is called a differential "hybrid" voltage buffer circuit or "DHVB". Due to all four transistors operating as amplifiers, the circuit of FIG. 4 for a given supply voltage and transistor size will generally output a higher output voltage swing as compared to the circuit of FIG. 3 if the two circuits are using the same supply voltage, and have the same transistor sizes, and are driving the same load. In addition, it is recognized that the signal in one leg of the circuit of FIG. 4 has two components. One component is due to the common source configuration transistor as driven by one part of the differential signal and the other component is due to the common drain configuration transistor as driven by the other part of the differential signal. Because the DHVB circuit combines the inverted signal of the common source stage from $V_{IN+}$ and the noninverted signal of the source follower stage from $V_{IN-}$, it can achieve higher gain and lower noise figure (NF) as compared to the circuit 15 of FIG. 3. In the DHVB circuit of FIG. 4, there is partial cancellation of the third derivative ($g_m''$) of the output current due to the combining of the inverted signal of common source transistor with the noninverted signal of the source follower transistor. Because the linearity of the circuit is dominated by the $g_m''$ nonlinearity, the DHVB circuit may exhibit a remarkable linearity improvement while simultaneously achieving low power consumption.

Unfortunately, as in the case of the differential signal output circuit 15 of FIG. 3, if the circuit 24 of FIG. 4 were to be used in the application mentioned above, then another one or more stages would typically be required in order to convert the differential output of the circuit 24 into the single-ended output signal need to drive the low impedance load. The DHVB circuit 24 of FIG. 4, which outputs a differential output signal, is therefore not generally suitable for use in an application where the circuit is to receive a differential input signal and is to drive a single-ended output signal to a low impedance load in such a way that the circuit is highly linear over a wide range of output powers.

SUMMARY

A wideband highly-linear buffer circuit exhibits a low output impedance over a wide frequency band and over a wide range of input signal power levels. Due to the low output impedance, the buffer circuit can drive a low input impedance load with lower power consumption as compared to a prior art circuit that has a higher output impedance. The output of the buffer circuit is also highly linear over a wide range of input signal powers. The output of the buffer circuit is also highly linear over a wide frequency band (for example, 4.9 GHz to 5.9 GHz).

The buffer circuit comprises a first signal transistor, a second signal transistor, a third signal transistor and a current source. The first signal transistor has a first terminal, a control terminal, and a second terminal. The current source has a first terminal and a second terminal, wherein the first terminal of the current source is coupled to the first terminal of the first signal transistor, and wherein the second terminal of the current source is coupled to the control terminal of the first signal transistor. The second signal transistor has a first terminal, a control terminal, and a second terminal, wherein the second terminal of the second signal transistor is coupled to the second terminal of the current source, and wherein the first terminal of the second signal transistor is coupled to the second terminal of the first signal transistor. The third signal transistor has a first terminal, a control terminal, and a second terminal, wherein the second terminal of the third signal transistor is coupled to the first terminal of the second signal transistor. The control terminal of the second signal transistor is AC coupled via a first bias circuit to a first input lead. The first bias circuit also DC biases the second signal transistor. In a single-ended input signal example, the control terminal of the third signal transistor is AC coupled via a second bias circuit to the second terminal of the second signal transistor. The second bias circuit also DC biases the third signal transistor. In a differential input signal example, the control terminal of the third signal transistor is AC coupled via a second bias circuit to a second input lead. The second bias circuit also DC biases the third signal transistor. In another differential input signal example, the current source further has a control terminal AC coupled via a third bias circuit to the first input lead, and therefore the current source acts as a fourth signal transistor. The third bias circuit also DC biases the fourth signal transistor.

The buffer circuit, in one example, is a part of a novel Radio Frequency (RF) transceiver integrated circuit. Within the novel transceiver, the buffer circuit is part of a Digital PreDistortion (DPD) loopback circuit. The buffer circuit is coupled to receive an attenuated version of a Power Amplifier (PA) output signal from a transmit chain of the transceiver. The buffer circuit converts that differential signal into a single-ended signal, and injects the resulting single-ended signal into a receive chain of the transceiver. In another example of the transceiver, a single-ended input version of the buffer circuit receives a single-ended signal from a node and conductor. The node and conductor is in a single-ended signal path between the output of the PA and the antenna. The single-ended version of the buffer circuit receives this single-ended signal and then injects a buffered version of the single-ended signal into the receive chain of the transceiver.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 9 sets forth an equation for the voltage gain of the wideband highly-linear buffer circuit 90 of FIG. 8.

FIG. 10 sets forth an equation for the output impedance of the wideband highly-linear buffer circuit 90 of FIG. 8.

FIG. 11 sets forth a voltage transfer function equation for $V_{INT}/V_{IN}$, where $V_{INT}$ is the voltage signal present on internal node 117 of the wideband highly-linear buffer circuit 90 of FIG. 8.

FIG. 12 is a graph that shows how the value $V_{INT}/V_{IN}$ changes as the input power of the $V_{IN}$ signal supplied to the conventional super source follower of FIG. 2 is increased from −20 dBm to 0 dBm, when the conventional super source follower of FIG. 2 is driving a 50 ohm load.

FIG. 13 is a graph that shows how the value $V_{INT}/V_{IN}$ changes as the input power of the $V_{IN}$ signal supplied to the novel wideband highly-linear buffer circuit 90 of FIG. 8. is increased from −20 dBm to 0 dBm, when the novel circuit 90 is driving a fifty ohm load.

DETAILED DESCRIPTION

Reference will now be made in detail to background examples and some embodiments of the invention, examples of which are illustrated in the accompanying drawings.

Figure 5:
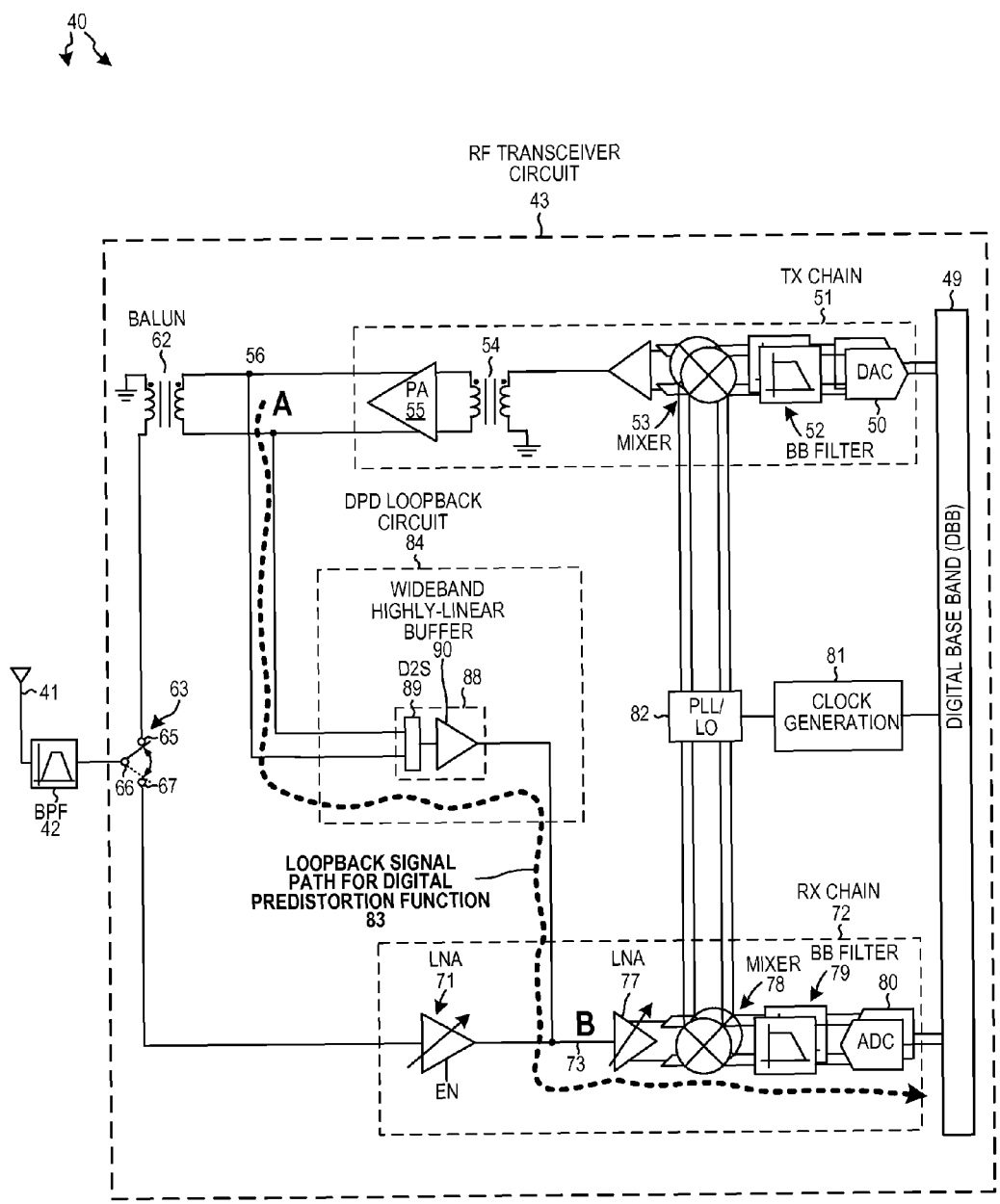
FIG. 5 is a circuit diagram of a Radio Frequency (RF) transceiver in accordance with one novel aspect.

FIG. 5 is a circuit diagram of a Radio Frequency (RF) transceiver 40 in accordance with one novel aspect. The RF transceiver 40 includes an antenna 41, a band pass filter 42 (optional), and an RF transceiver circuit 43. The transceiver integrated circuit 44 includes a Digital Baseband (DBB) portion 49. When the RF transceiver 40 is transmitting, a stream of digital values output by the DBB portion 49 is supplied to a Digital-to-Analog Converter (DAC) 50 of a transmit chain 51. The transmit chain 51 includes the DAC 50, a Baseband (BB) filter 52, a mixer 53, a transformer 54, and a Power Amplifier (PA) 55. The DAC 50 converts the stream of digital values into a corresponding analog signal, and the analog signal is filtered by the BB filter 52, and is upconverted to an RF transmission frequency by mixer 53. The upconverted signal passes through transformer 54 and is amplified by PA 55. The resulting amplified high power differential RF signal passes to balun 62. Balun 62 converts the differential signal output by the PA into a single-ended signal. The resulting single-ended signal passes from the balun, across a signal conductor, and through a switch 63, to the band pass filter 42, and through the band pass filter 42 to the antenna 41 so that a high frequency RF signal radiates from the antenna 41. The RF transceiver 40 in this case is a WiFi transceiver and the radiated signal is a WiFi signal in the frequency of 4.9 GHz to 5.9 GHz range. The switch 63 is set in the switch position as illustrated so that switch terminal 65 of the switch 63 is coupled to switch terminal 66.

When the RF transceiver 40 is receiving, the switch 63 is set in the other switch position so that switch terminal 66 is coupled to switch terminal 67. A radiating 4.9 GHz to 5.9 GHz WiFi signal is received onto antenna 41. The received signal passes through band pass filter 42, and through switch 63, and to the input lead of a Low Noise Amplifier (LNA) 71 of a receiver chain 72. The LNA 71 outputs an amplified version of the high frequency signal onto node and conductor 73. The amplified signal passes to another LNA 77 in the transceiver integrated circuit. The resulting signal is downconverted by mixer 78. The downconverted signal is filtered by baseband filter 79, and the filtered differential signal is digitized by Analog-to-Digital Converter (ADC) 80 into a stream of digital values. The stream of digital values is supplied to the DBB portion 49 for further processing in the digital domain. The mixers 53 and 78 are driven by Local Oscillator (LO) signals. The LO signals are generated by a clock generator circuit 81 and an associated Phase-Locked Loop and Local Oscillator (PLL/LO) circuit 82.

The transmit chain 51 and the PA 55 in particular exhibits an amount of nonlinearity and introduces unwanted distortion into the RF output signal. Digital Pre-Distortion (DPD) techniques are employed whereby a known signal is supplied to the input of the transmit chain 51. The signal that is output by the power amplifier 55 is then detected along with any distortion in that signal. The signal on the output of the power amplifier 55 is conveyed back to digital processing circuitry in the digital base band (DBB) portion 49 via a loopback signal path 83 in high-fidelity form. This loopback signal path 83 is illustrated in FIG. 5 by a dashed line and arrow. The path starts at the output of the power amplifier 55, and passes through a RF loopback circuit 84, through LNA 77, through downconverter mixer 78, through baseband filter 79, through ADC 80, and to the DBB portion 49. The digital predistortion functionality detects and determines how the transmit chain 51 distorted the signal that was output by the DBB portion 49. A signal as output by the DBB portion 49 can then be output from the DBB portion 49 and injected into the transmit chain 51 in "predistorted" form so that when the transmit chain 51 distorts the predistorted signal, the signal will be distorted back to the desired signal (free of distortion). The resulting distortionless signal can then be radiated out from antenna 41.

The RF loopback circuit 84 used in the digital predistortion operation should be highly linear over a wide range of power amplifier (PA) 55 output powers. Otherwise, RF loopback circuit 84 will introduce extra distortion components into the loopback signal, which will result in the DPD algorithm failing to correct the intrinsic distortion of PA 55. The voltage amplitude of the differential signal at point A can vary widely, and the RF loopback circuit 84 is to handle this signal regardless of its amplitude without distortion. The RF lookback circuit 84 should also be highly linear over the entire operating frequency range of the PA 55. The DPD loopback circuit 84 receives the potentially high amplitude differential signal from point A and generates a single-ended version of this signal, and injects the single-ended signal at point B into the receive chain 72. The single-ended signal is injected into the low input impedance of the receive chain 72 at node 73. If the overall RF transceiver 40 is receiving, then the LNA 71 is enabled. If, however, the output of the power amplifier 55 is being fed back to the DBB portion 49 in a DPD loopback test, then the LNA 71 is disabled. In the illustrated example, the LNA 71 receives a digital enable signal EN that selectably enables and disables the LNA 71.

The DPD loopback circuit 84 includes a novel "wideband highly-linear D2S and buffer circuit" 88. The "wideband highly-linear D2S and buffer circuit" 88 in turn includes a Differential to Single-Ended (D2S) circuit 89 and an instance of the novel "wideband highly-linear buffer circuit" 90. The differential signal as received onto the D2S circuit 89 is converted into a single-ended signal by the D2S circuit, and a single-ended signal is output by the wideband highly-linear buffer circuit 90 at point B.

Figure 6:
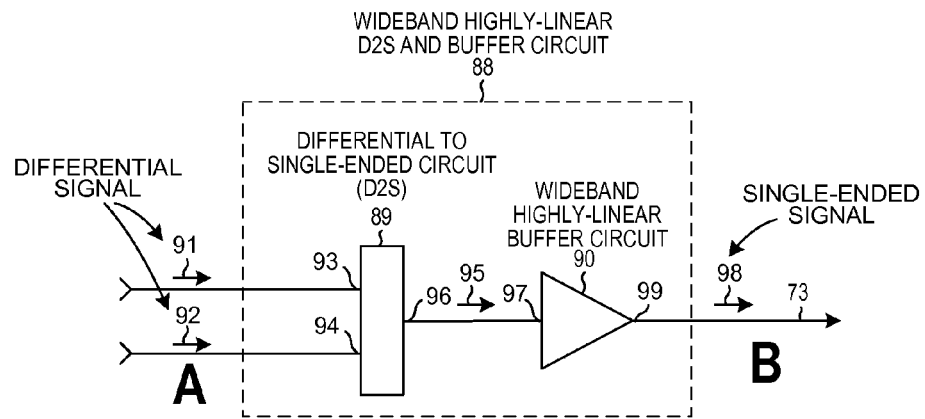
FIG. 6 is a more detailed block diagram of the "wideband highly-linear D2S and buffer circuit" 88 of FIG. 5.

FIG. 6 is a more detailed block diagram of the "wideband highly-linear D2S and buffer circuit" 88. A differential signal as received at point A is represented by arrows 91 and 92. The differential signal is received onto leads and nodes 93 and 94 of the D2S circuit 89. The D2S circuit 89 outputs a single-ended signal 95 via output lead 96 onto the input lead 97 of the novel "wideband highly-linear buffer circuit" 90. The wideband highly-linear buffer circuit 90 receives the single-ended signal 95 via input lead 97 and drives a single-ended signal 98 via output lead 99 onto a low input impedance load at point B.

Figure 7:
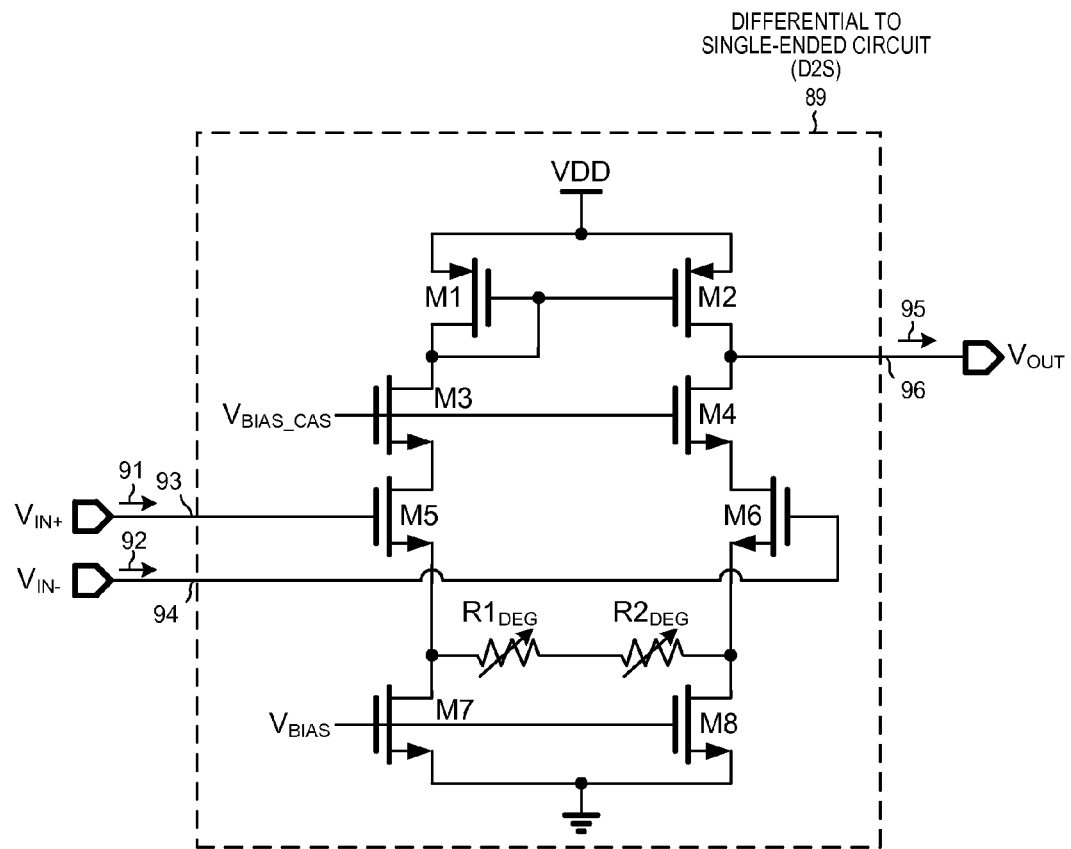
FIG. 7 is a more detailed circuit diagram of the D2S circuit 89 of FIG. 6.

FIG. 7 is a more detailed circuit diagram of the D2S circuit 89. P-channel field effect transistors (PFETs) M1 and M2 form a current mirror, and provide loads for the signal N-channel field effect transistors (NFETs) M5 and M6. NFETs M7 and M8 operate like current sources, and provide DC currents for the differential pair NFETs M5 and M6. NFETs M7 and M8 operate as cascode transistors. Transistors M7 and M8 increase the voltage gain of D2S and suppress the Miller effect of NFETs M5 and M6. Programmable resistors $R1_{DEG}$ and $R2_{DEG}$ are used to set or adjust the gain of the D2S circuit 89. If the resistors $R1_{DEG}$ and $R2_{DEG}$ have low resistances, then the D2S circuit 89 has higher gain. If the resistors $R1_{DEG}$ and $R2_{DEG}$ have higher resistances, then the D2S circuit 89 has lower gain. The D2S circuit 89 receives the differential signal 91-92 via differential input leads 93 and 94, and outputs the single-ended signal 95 via output lead 96.

Figure 8:
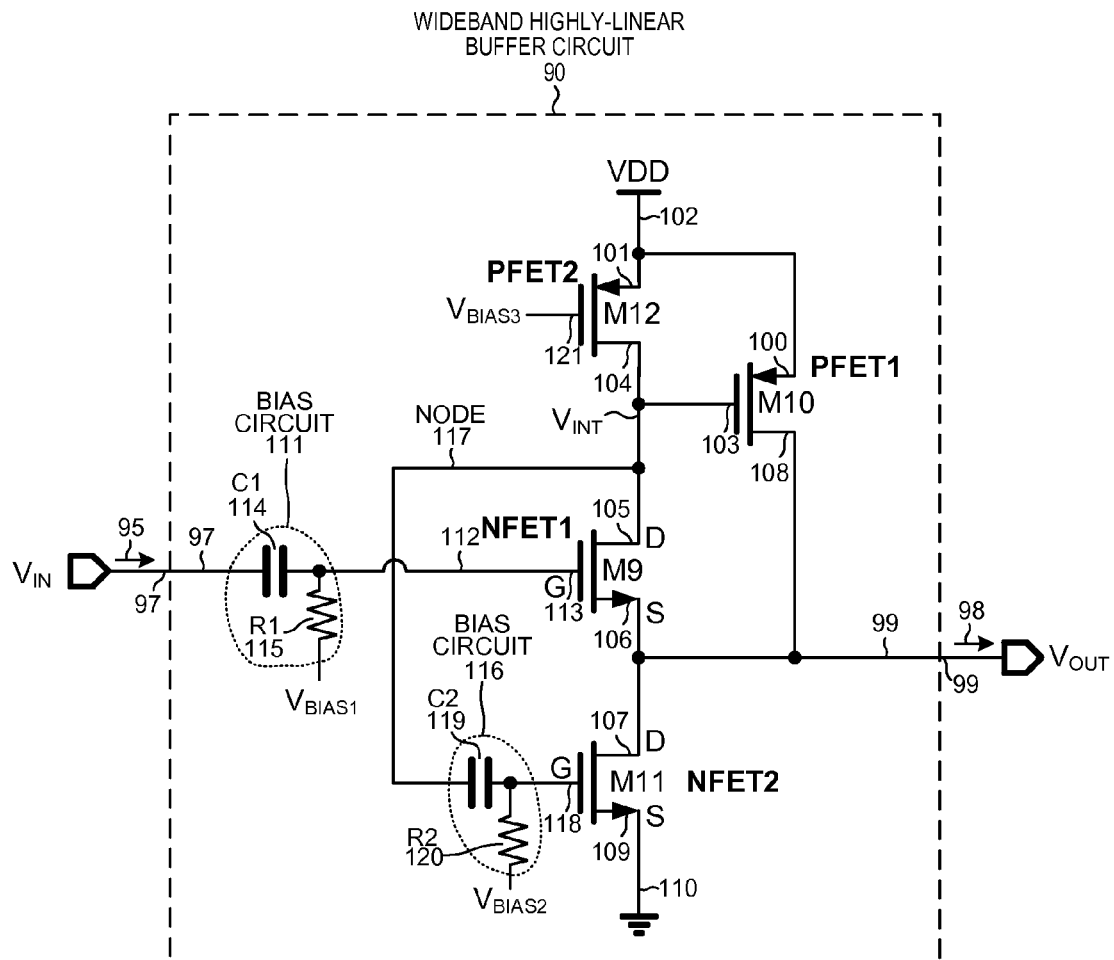
FIG. 8 is a more detailed circuit diagram of the wideband highly-linear buffer circuit 90 of FIG. 6.

FIG. 8 is a more detailed circuit diagram of the wideband highly-linear buffer circuit 90. The wideband highly-linear buffer circuit 90 includes a first signal transistor, a second signal transistor, a third signal transistor and a current source. In this embodiment, the second signal transistor is implemented by a first NFET M9, the third signal transistor is implemented by a second NFET M11, the first signal transistor is implemented by a first PFET M10, and the current source is implemented by a second PFET M12. The first terminal (e.g., source) 100 of the first signal transistor (e.g., the first PFET M10) is coupled to the first terminal (e.g., source) 101 of the current source (e.g., the second PFET M12) as well as to a VDD supply voltage conductor 102. The control terminal (e.g., gate) 103 of the first signal transistor (e.g., the first PFET M10) is coupled to the second terminal (e.g., drain) 104 of the current source (e.g., the second PFET M12) and to the second terminal (e.g., drain) 105 of the second signal transistor (e.g., the first NFET M9). The first terminal (e.g., source) 106 of the second signal transistor (e.g., the first NFET M9) is coupled to the second terminal (e.g., drain) 107 of the third signal transistor (e.g., the second NFET M11), to the second terminal (e.g., drain) 108 of the first signal transistor (e.g., the first PFET M10), and to output lead and conductor 99. The first terminal (e.g., source) 109 of the third signal transistor (e.g., the second NFET M11) is coupled to a ground conductor 110.

A first bias circuit 111 AC couples the input lead and conductor 97 to conductor 112 and to the control terminal (e.g., gate) 113 of the second signal transistor (e.g., the first NFET M9). The first bias circuit 111 includes a capacitor C1 114 and a bias resistor R1 115. The second signal transistor (e.g., first NFET M9) is DC biased by a first DC bias voltage $V_{BIAS1}$. The bias resistor R1 has a first terminal end and a second terminal end. The first terminal end of bias resistor R1 is coupled to the control terminal (e.g., gate) 113 of the second signal transistor (e.g., the first NFET M9). The second terminal end of bias resistor R1 is coupled to receive the first bias voltage $V_{BIAS1}$ from a bias voltage generator circuit (not shown). A first plate of the capacitor C1 is coupled to the buffer input lead and conductor 97. A second plate of the capacitor C1 is coupled to the control terminal (e.g., gate) 113 of the second signal transistor (e.g., the first NFET M9).

A second bias circuit 116 AC couples the node 117 (at the second terminal (e.g., drain) 105 of the second signal transistor (e.g., the first NFET M9)) to the control terminal (e.g., gate) 118 of the third signal transistor (e.g., the second NFET M11). The second bias circuit 116 includes a capacitor C2 119 and a bias resistor R2 120. The bias resistor R2 has a first terminal end and a second terminal end. The first terminal end of bias resistor R2 is coupled to the control terminal (e.g., gate) 118 of the third signal transistor (e.g., the second NFET M11). The second terminal end of bias resistor R2 is coupled to receive a second bias voltage $V_{BIAS2}$ from the bias voltage generator circuit. A first plate of capacitor C2 119 is coupled to node 117 and the second terminal (e.g., drain) 105 of the second signal transistor (e.g., first NFET M9). A second plate of capacitor C2 119 is coupled to the control terminal (e.g., gate) 118 of the third signal transistor (e.g., the second NFET M11).

The control terminal (e.g., gate) 121 of the current source (e.g., the second PFET M12) is coupled to receive a third DC bias voltage $V_{BIAS3}$ from the bias voltage generator circuit. The DC bias voltage generator circuit that outputs the three DC bias voltages $V_{BIAS1}$, $V_{BIAS2}$ and $V_{BIAS3}$ is, in the present example, a Proportional To Absolute Temperature (PTAT) type reference circuit.

Figure 1:
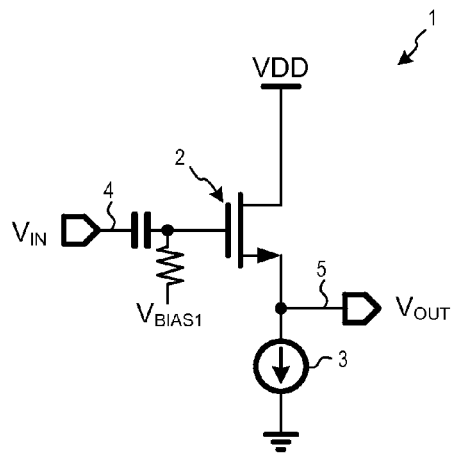
FIG. 1 (Prior Art) is a circuit diagram of a common drain source follower circuit.
Figure 2:
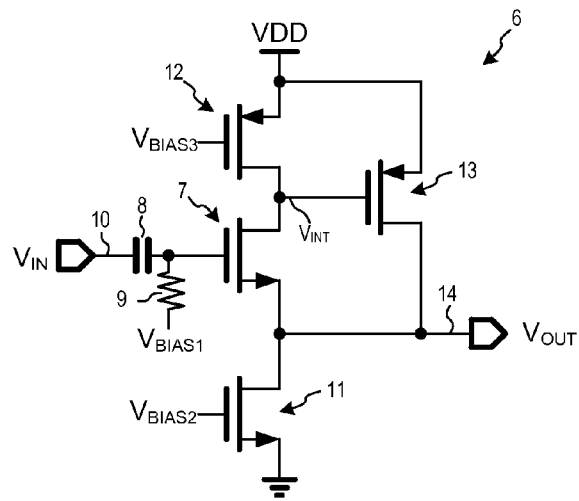
FIG. 2 (Prior Art) is a circuit diagram of a modified source follower circuit that has even a lower output impedance than the circuit of FIG. 1.
Figure 3:
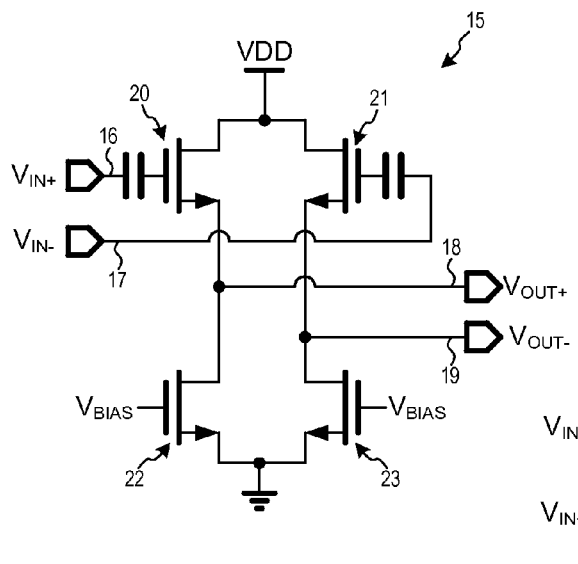
FIG. 3 (Prior Art) is a diagram of another buffer circuit that might be considered for use in receiving a differential input signal and outputting a single-ended signal to a low impedance load.
Figure 4:
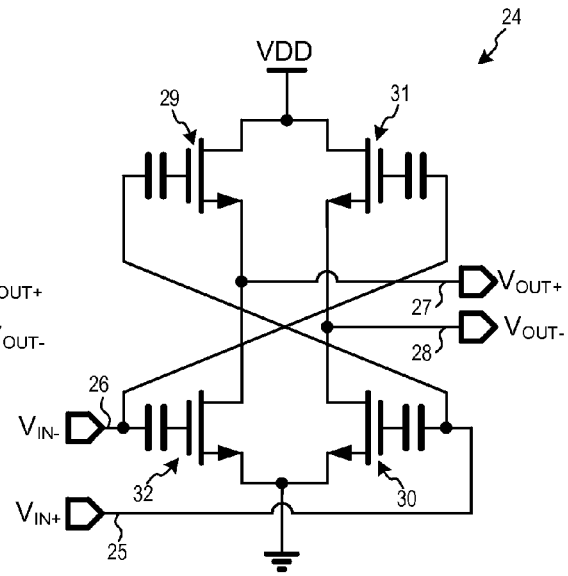
FIG. 4 (Prior Art) is a diagram of an improved version of the circuit of FIG. 3.

The first NFET M9 operates similarly to the signal transistor 7 of the super source follower circuit of FIG. 2. The first PFET M10 operates similarly to the transistor 13 of the super source follower circuit of FIG. 2. The second PFET M12 operates as a current source in similar fashion to the current source 12 of FIG. 2. The first DC bias circuit 111 operates similarly to the DC bias circuit of capacitor 8 and resistor 9 in the super source follower circuit 6 of FIG. 2. Unlike the prior art super source follower of FIG. 2, the wideband highly-linear buffer circuit 90 includes the second bias circuit 116. Whereas the gate of the transistor 11 in the super source follower circuit 6 of FIG. 2 is only supplied with a DC voltage, the gate 118 of the second NFET M11 in the wideband highly-linear buffer circuit 90 of FIG. 8 is AC coupled by the second bias circuit 116 to node 117. The AC component of the signal on node 117 is AC coupled via the second bias circuit 116 onto the gate 118 of the second NFET M11. The second NFET M11 therefore does not just operate as a current source as in the super source follower circuit of FIG. 2, but rather the second NFET M11 has a signal amplifying function. Accordingly, both the first NFET M9 and the second NFET M11 operate as signal transistors in the circuit of FIG. 8, whereas the NFET 11 in the conventional super source follower circuit 6 of FIG. 2 does not operate as a signal transistor. Please note that the configurations of the NFETs and PFETs illustrated in FIG. 8 are not limitations of the present invention. A skilled person should be appreciated that, with slight modifications, NFETs may be replaced by PFETs, and PFETs may be replaced by NFETs.

FIG. 9 sets forth an equation for the voltage gain $V_{OUT}/V_{IN}$ of the wideband highly-linear buffer circuit 90 of FIG. 8. The load resistance $R_L$, where the circuit 90 of FIG. 8 is driving node 73 of FIG. 5, is less than 50 ohms. The equation of FIG. 9 is derived by hand using Kirchhoff's Voltage/Current Law (KVL/KCL) analysis techniques. A system of current node equations is developed, where there is one such equation for each current node in the circuit. Each of the transistors M9-M12 is described using the small signal model of a transistor. The system of equations is then solved for $V_{OUT}/V_{IN}$.

FIG. 10 sets forth an equation for the output impedance of the wideband highly-linear buffer circuit 90 of FIG. 8.

FIG. 11 sets forth a voltage transfer function equation for $V_{INT}/V_{IN}$, where $V_{INT}$ is the voltage signal present on internal node 117 of the wideband highly-linear buffer circuit 90 of FIG. 8.

FIG. 12 is a graph that shows how the value $V_{INT}/V_{IN}$ changes as the input power of the $V_{IN}$ signal supplied to the conventional super source follower of FIG. 2 is increased from −20 dBm to 0 dBm, when the conventional super source follower of FIG. 2 is driving a 50 ohm load. Note that the value of $V_{INT}/V_{IN}$ is approximately −1.0 dB.

FIG. 13 is a graph that shows how the value $V_{INT}/V_{IN}$ changes as the input power of the $V_{IN}$ signal supplied to the novel wideband highly-linear buffer circuit 90 of FIG. 8 is increased from −20 dBm to 0 dBm, when the novel circuit 90 is driving a fifty ohm load. Note that the value of $V_{INT}/V_{IN}$ is approximately −6.9 dB. A comparison of FIG. 12 and FIG. 13 reveals that the internal node at the drain of the main signal transistor (transistor M9 in FIG. 8 and transistor 7 in FIG. 2) is quiet in the circuit of FIG. 8 as compared to the conventional circuit of FIG. 2.

Figure 14:
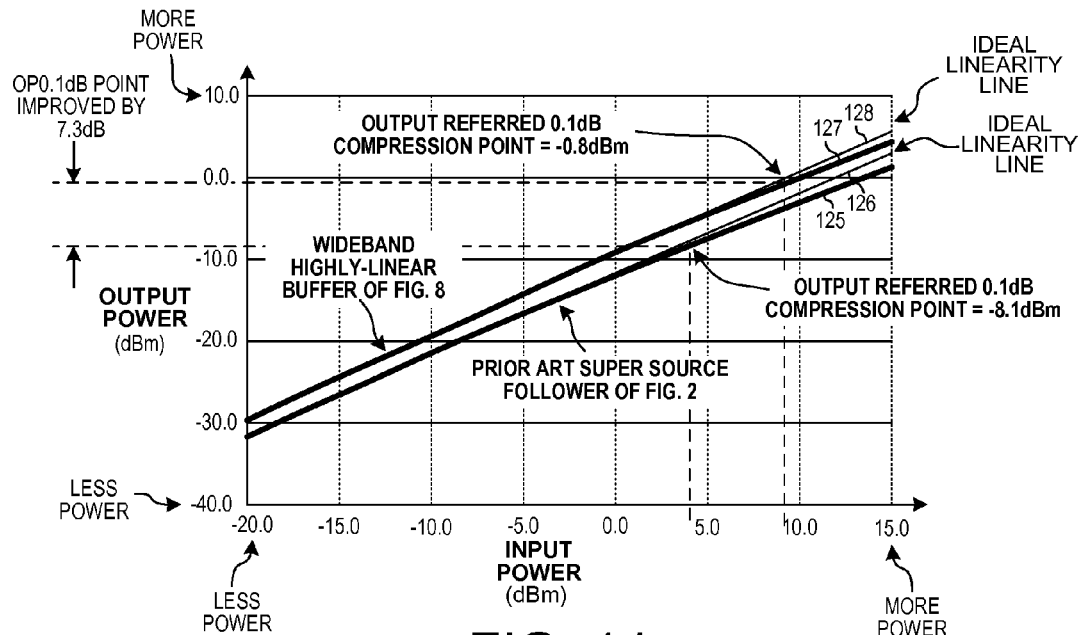
FIG. 14 is a power transfer curve graph that shows how the novel wideband highly-linear buffer circuit 90 of FIG. 8 is more linear as compared to the conventional super source follower circuit of FIG. 2.

FIG. 14 is a power transfer curve graph that shows how the novel wideband highly-linear buffer circuit 90 of FIG. 8 is more linear as compared to the conventional super source follower circuit of FIG. 2. The output referred 0.1 dB compression point (OP0.1 dB) is the output power level of a circuit at which the output signal as output from the circuit differs in power magnitude from the ideal power magnitude by an amount of 0.1 dB. In FIG. 14, the heavy line 125 represents the power magnitude of the output signal as output by the conventional super source follower circuit of FIG. 2, and the thinner line 126 represents the power magnitude of the ideal output signal. As the input power is increased, the output power ideally increases linearly. The graph shows that as the magnitude of the input power to the conventional super source follower circuit of FIG. 2 is increased, the magnitude of the output power actually begins to fall as compared to the desired ideal output signal power magnitude. The OP0.1 dB compression point for the conventional source follower circuit of FIG. 2 occurs at an output power level of about −8.1 dBm. In comparison, the heavy line 127 in FIG. 14 represents the magnitude of the output signal as output by the novel circuit 90 of FIG. 8, and the thinner line 128 represents the magnitude of the ideal output signal. Again, as the input power is increased, the output power ideally increases linearly. The graph shows that as the magnitude of the input power to the novel circuit of FIG. 8 is increased, the power magnitude of the output signal actually begins to fall as compared to the desired ideal output signal power magnitude. The OP0.1 dB compression point, however, occurs at a higher output power of about −0.8 dBm. As indicated at the left side of the graph, the output power of the OP0.1 dB compression point is increased by 7.3 dB. Accordingly, in the circuit of FIG. 5, as the output power level as output by the power amplifier (PA) 55 increases to high power levels, the novel wideband highly-linear buffer 90 is able to communicate the signal back to the DBB portion 49 through the DPD loopback path 83 with less distortion as compared to another instance of the circuit where a conventional super source follower is used in place of the wideband highly-linear buffer 90.

Figure 15:
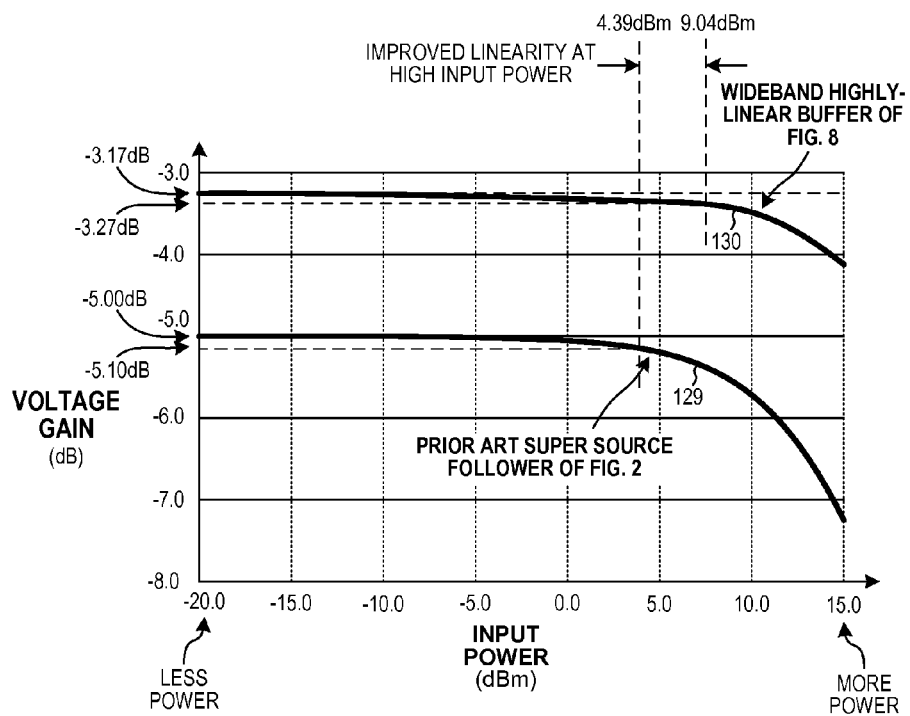
FIG. 15 is a graph that shows how the voltage gain of the novel wideband highly-linear buffer circuit 90 of FIG. 8 is more linear at high input power levels as compared to the conventional super source follower circuit of FIG. 2.

FIG. 15 is a graph that shows how the voltage gain of the novel wideband highly-linear buffer circuit 90 of FIG. 8 is more linear at high input power levels as compared to the conventional super source follower circuit of FIG. 2. Heavy line 129 represents the voltage gain of the conventional super source follower circuit of FIG. 2. The 0.1 dB gain compression point occurs when the input power level reaches about 4.39 dBm. Heavy line 130 represents the voltage gain of the novel wideband highly-linear buffer circuit 90 of FIG. 8. Note that voltage gain remains fairly constant past 5 dBm, and that the 0.1 dB gain compression point occurs when the input power level reaches about 9.04 dBm.

Figure 16:
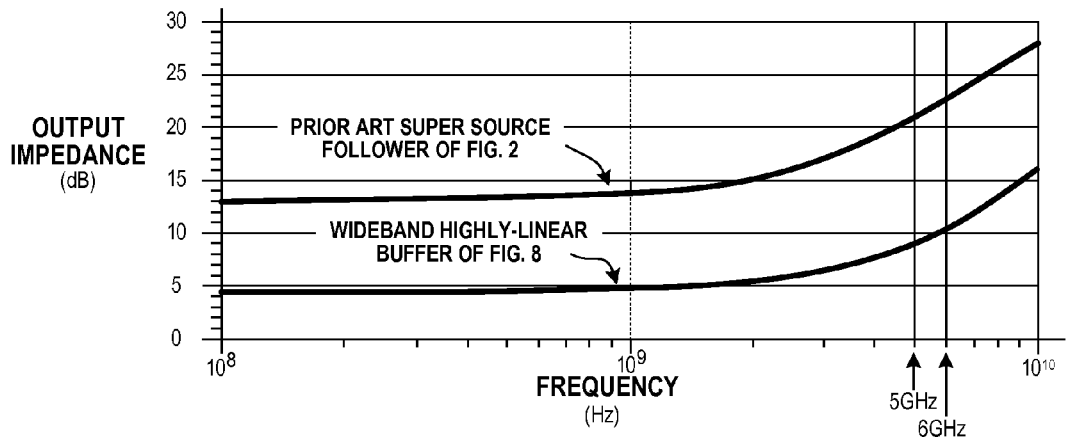
FIG. 16 is a graph that illustrates the wideband operation of the novel wideband highly-linear buffer circuit 90 of FIG. 8 as compared to the conventional super source follower circuit of FIG. 2.

FIG. 16 is a graph that illustrates the wideband operation of the novel wideband highly-linear buffer circuit 90 of FIG. 8 as compared to the conventional super source follower circuit of FIG. 2. To work well in the circuit of FIG. 5, the wideband highly-linear buffer circuit 90 should have a low output impedance throughout the frequency operating range of the buffer. Having a low output impedance allows the buffer circuit to drive the low impedance load at node 73 with a satisfactorily low power consumption. As FIG. 16 shows, the output impedance of the novel wideband highly-linear buffer circuit 90 of FIG. 8 is less than half of the output impedance of the conventional super source follower circuit for WiFi A-Band operation in the range from 4.9 GHz to 5.9 GHz.

Figure 17:
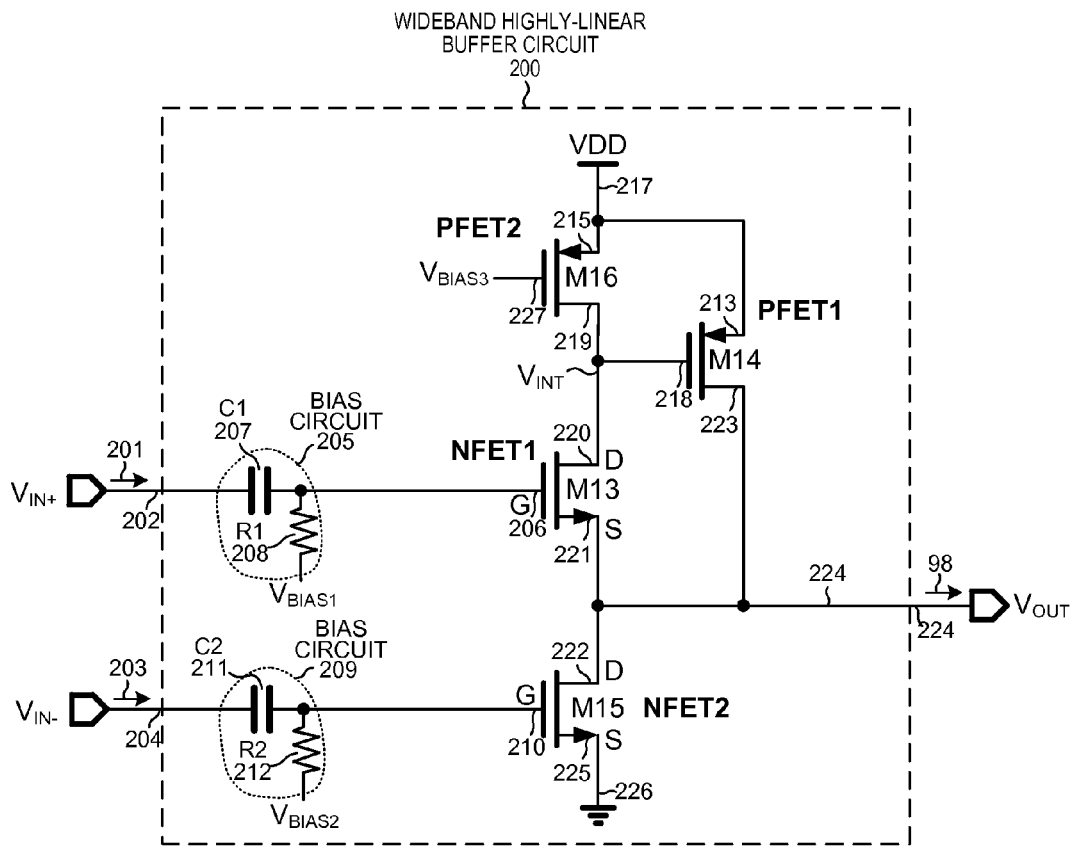
FIG. 17 is a circuit diagram of a wideband highly-linear buffer circuit 200 in accordance with a second novel aspect.

FIG. 17 is a circuit diagram of a wideband highly-linear buffer circuit 200 in accordance with a second novel aspect. Rather than receiving a single-ended input signal as is the case with the circuit 90 of FIG. 8, the circuit 200 receives a differential input signal. The $V_{IN+}$ component 201 of the input signal is received onto input lead 202. The $V_{IN-}$ component 203 of the input signal is received onto input lead 204. The circuit 200 includes a first signal transistor, a second signal transistor, a third signal transistor and a current source. In this embodiment, the second signal transistor is implemented by a first NFET M13, the third signal transistor is implemented by a second NFET M15, the first signal transistor is implemented by a first PFET M14, and the current source is implemented by a second PFET M16. The third signal transistor (e.g., second NFET M15), rather than being driven by an AC signal taken from the drain of the second signal transistor (e.g., the first NFET M13) as in the case of the circuit 90 of FIG. 8, is driven by the $V_{IN-}$ component of the input signal on input lead 204. A first bias circuit 205 AC couples the $V_{IN+}$ input lead 202 to the control terminal (e.g., gate) 206 of the second signal transistor (e.g., the first NFET M13). The first bias circuit 205 includes a capacitor 207 and a resistor 208. The second bias circuit 209 AC couples the $V_{IN-}$ input lead 204 to the control terminal (e.g., gate) 210 of the third signal transistor (e.g., the second NFET M15). The second bias circuit 209 includes a capacitor 211 and a resistor 212. The first terminal (e.g., source) 213 of the first signal transistor (e.g., the first PFET M14) is coupled to the first terminal (e.g., source) 215 of current source (e.g., the second PFET M16) and to a VDD supply voltage conductor 217. The control terminal (e.g., gate) 218 of the first signal transistor (e.g., the first PFET M14) is coupled to the second terminal (e.g., drain) 219 of the current source (e.g., the second PFET M16) and to the second terminal (e.g., drain) 220 of the second signal transistor (e.g., the first NFET M13). The first terminal (e.g., source) 221 of the second signal transistor (e.g., the first NFET M13) is coupled to the second terminal (e.g., drain) 222 of the third signal transistor (e.g., the second NFET M15), to the second terminal (e.g., drain) 223 of the first signal transistor (e.g., the first PFET M14), and to output lead and conductor 224. The first terminal (e.g., source) 225 of the third signal transistor (e.g., the second NFET M15) is coupled to a ground conductor 226. The control terminal (e.g., gate) 227 of the current source (e.g., the second PFET M16) is coupled to receive a third bias voltage $V_{BIAS3}$. Please note that the configurations of the NFETs and PFETs illustrated in FIG. 17 are not limitations of the present invention. A skilled person should be appreciated that, with slight modifications, NFETs may be replaced by PFETs, and PFETs may be replaced by NFETs.

Figure 18:
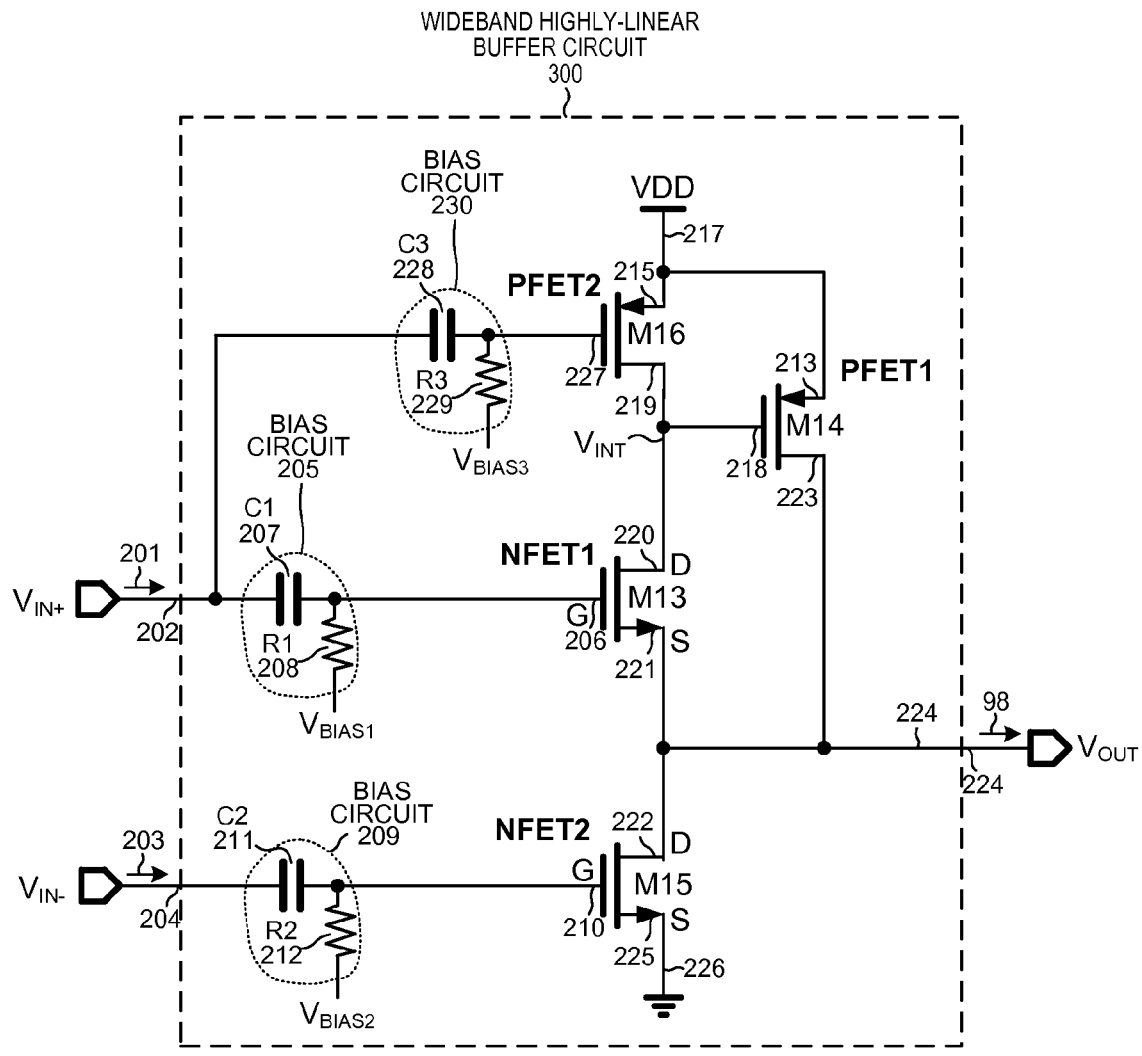
FIG. 18 is a circuit diagram of a wideband highly-linear buffer circuit 300 in accordance with a third novel aspect.

FIG. 18 is a circuit diagram of a wideband highly-linear buffer circuit 300 in accordance with a third novel aspect. Much of the circuit 300 of FIG. 18 has a similar topology and operation to the circuit 200 of FIG. 17, so the same reference numerals are used in FIG. 18 as FIG. 17 to indicate corresponding similar structures that were described above in connection with FIG. 17. Rather than the second PFET M16 operating only as a current source as in the case of the circuit 200 of FIG. 17, however, the gate 227 of the second PFET M16 is AC coupled by capacitor C3 228 to the $V_{IN}+$ input lead 202. As a result, the second PFET M16 receives the $V_{IN+}$ component of the differential input signal and operates as a common source amplifier to amplify that signal. The third DC bias voltage $V_{BIAS3}$ is supplied to the gate 227 of the second PFET M16 via resistor R3 229. Capacitor C3 228 and resistor R3 229 form a third bias circuit 230.

Figure 19:
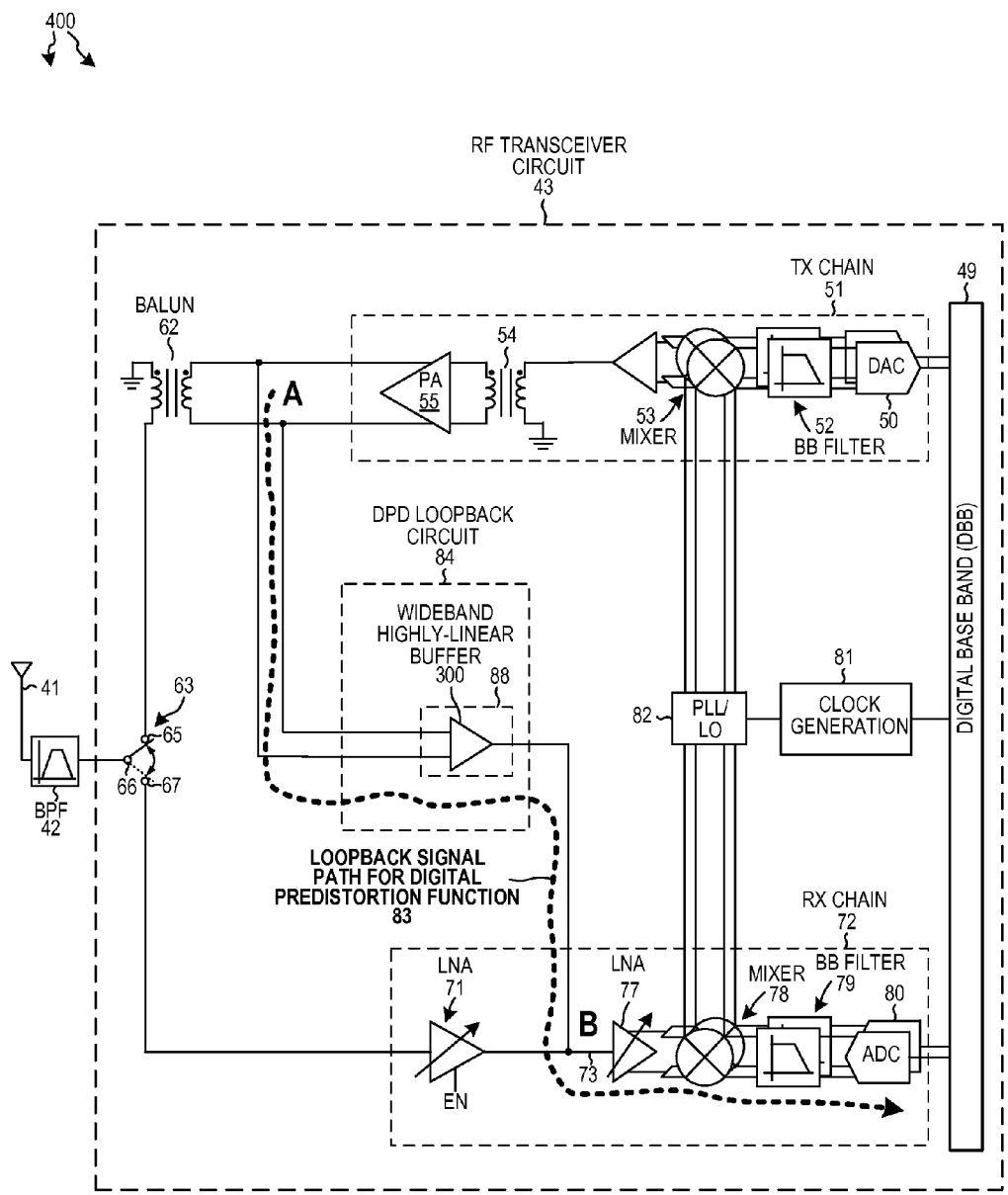
FIG. 19 is a circuit diagram of a Radio Frequency (RF) transceiver 400 in accordance with another novel aspect.

FIG. 19 is a circuit diagram of a Radio Frequency (RF) transceiver 400 in accordance with another novel aspect. Much of the transceiver 400 of FIG. 19 has a similar topology and operation to the transceiver 40 of FIG. 5, so the same reference numerals are used in FIG. 19 as FIG. 5 to indicate corresponding similar structures that were described above in connection with FIG. 5. Rather than the "wideband highly-linear D2S and buffer circuit" 88 including a D2S circuit 89 followed by an instance of the novel "wideband highly-linear buffer circuit" 90 as shown in FIG. 5, the "wideband highly-linear D2S and buffer circuit" 88 of FIG. 19 is a single instance of the differential to single-ended buffer circuit 300 of FIG. 18.

Figure 20:
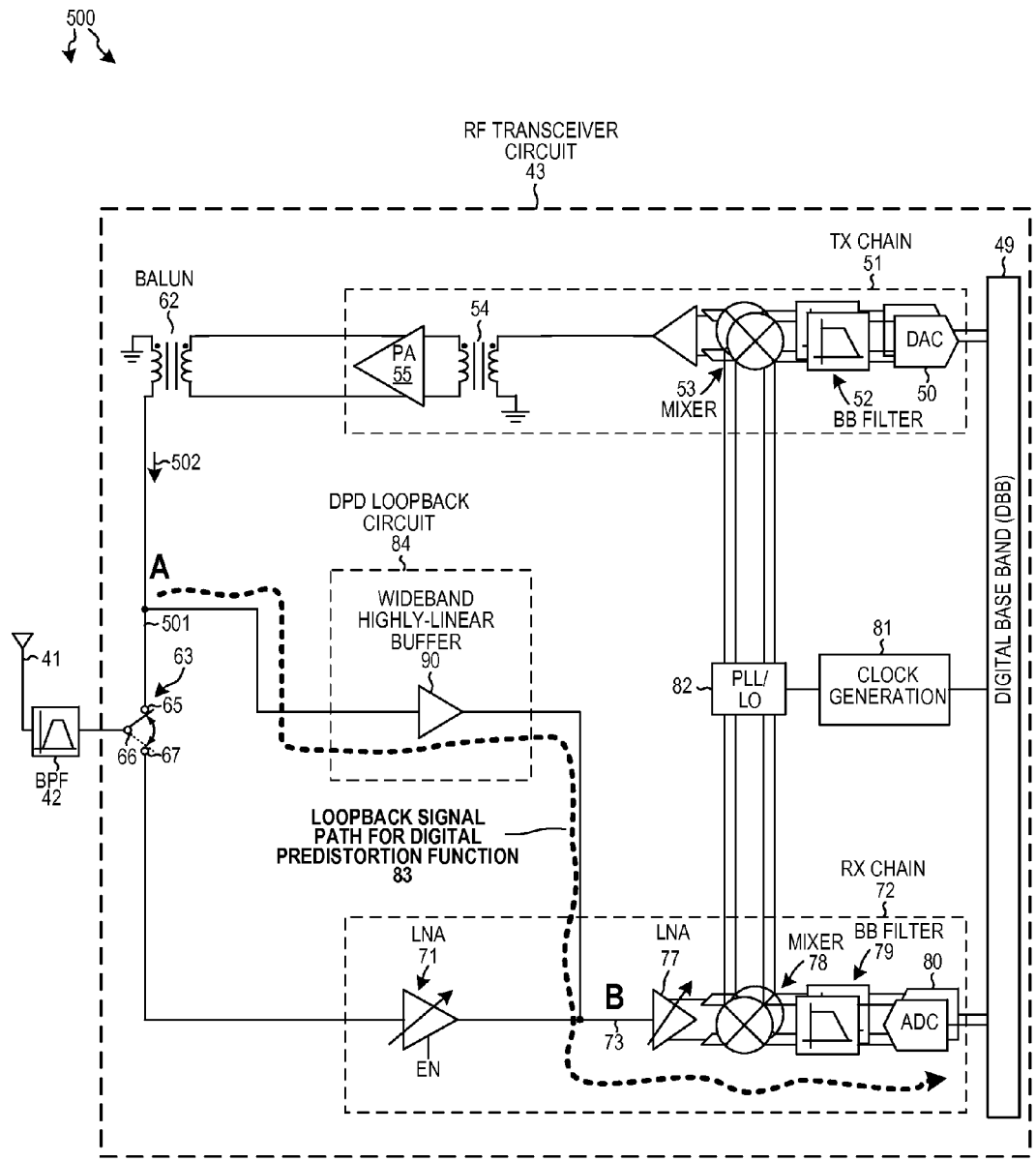
FIG. 20 is a circuit diagram of a Radio Frequency (RF) transceiver 500 in accordance with another novel aspect.

FIG. 20 is a circuit diagram of a Radio Frequency (RF) transceiver 500 in accordance with another novel aspect. Much of the transceiver 500 of FIG. 20 has a similar topology and operation to the transceiver 40 of FIG. 5, so the same reference numerals are used in FIG. 20 as FIG. 5 to indicate corresponding similar structures that were described above in connection with FIG. 5. Rather than the DPD loopback circuit 84 of FIG. 20 receiving a differential signal and outputting a single-ended signal as in the case of the transceiver of FIG. 5, the DPD loopback circuit 84 of FIG. 20 receives a single-ended signal and outputs a single-ended signal as illustrated. Rather than receiving an input signal from the differential output of PA 55, the DPD loopback circuit 84 receives a single-ended signal 502 from node 501. Node 501 is a node in the signal path of the single-ended signal 502 between an output of balun 62 and the switch 63. In the example of FIG. 20, the DPD lookback circuit 84 includes no D2S circuit. The DPD lookback circuit 84 buffers single-ended signals and includes an instance of the single-ended to single-ended wideband highly-linear buffer circuit 90 of FIG. 8.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A circuit comprising:
   a first signal transistor having a first terminal, a control terminal, and a second terminal;
   a current source having a first terminal and a second terminal, wherein the first terminal of the current source is coupled to the first terminal of the first signal transistor, and wherein the second terminal of the current source is coupled to the control terminal of the first signal transistor;
   a second signal transistor having a first terminal, a control terminal, and a second terminal, wherein the second terminal of the second signal transistor is coupled to the second terminal of the current source, and wherein the first terminal of the second signal transistor is coupled to the second terminal of the first signal transistor;
   a third signal transistor having a first terminal, a control terminal, and a second terminal, wherein the second terminal of the third signal transistor is coupled to the first terminal of the second signal transistor;
   a buffer input;
   a first bias circuit that AC couples the buffer input to the control terminal of the second signal transistor;
   a second bias circuit that AC couples the second terminal of the second signal transistor to the control terminal of the third signal transistor;
   a double-ended to single-ended (D2S) circuit having an D2S output lead, wherein the D2S output lead is coupled to the buffer input;
   a receive chain comprising a Low Noise Amplifier (LNA), a mixer, and a base band filter, wherein the buffer output is coupled to inject a signal into the receive chain;
   a transmit chain comprising a base band filter, a mixer, and a Power Amplifier (PA), wherein the PA is coupled to the buffer input such that a differential signal output by the PA is supplied in attenuated form to the D2S circuit; and
   a buffer output that is coupled to the first terminal of the second signal transistor.

2. The circuit of claim 1, wherein the first bias circuit comprises:
   a first capacitor having a first plate and a second plate, wherein the first plate of the first capacitor is coupled to the buffer input, and wherein the second plate of the first capacitor is coupled to the control terminal of the second signal transistor.

3. The circuit of claim 2, wherein the first bias circuit further comprises:
   a first bias resistor that has a first terminal end and a second terminal end, wherein the first terminal end of the first bias resistor is coupled to the control terminal of the second signal transistor.

4. The circuit of claim 3, wherein the second bias circuit comprises:
   a second capacitor having a first plate and a second plate, wherein the first plate of the second capacitor is coupled to the second terminal of the second signal transistor, and wherein the second plate of the second capacitor is coupled to the control terminal of the third signal transistor.

5. The circuit of claim 4, wherein the second bias circuit further comprises:
a second bias resistor that has a first terminal end and a second terminal end, wherein the first terminal end of the second bias resistor is coupled to the control terminal of the third signal transistor.

6. The circuit of claim 5, wherein a first bias voltage is present on the second terminal end of the first resistor of the first bias circuit, wherein a second bias voltage is present on the second terminal end of the second resistor of the second bias circuit, and wherein a third bias voltage is present on a control terminal of the current source.

7. The circuit of claim 1, wherein the current source is a field effect transistor, wherein the field effect transistor has a gate, and wherein the control terminal of the current source is the gate of the field effect transistor.

8. The circuit of claim 1, further comprising:
a supply voltage conductor that is coupled to the first terminal of the current source and to the first terminal of the first signal transistor; and
a ground conductor that is coupled to the first terminal of the third signal transistor.

9. A circuit comprising:
a first signal transistor having a first terminal, a control terminal, and a second terminal;
a current source having a first terminal and a second terminal, wherein the first terminal of the current source is coupled to the first terminal of the first signal transistor, and wherein the second terminal of the current source is coupled to the control terminal of the first signal transistor;
a second signal transistor having a first terminal, a control terminal, and a second terminal, wherein the second terminal of the second signal transistor is coupled to the second terminal of the current source, and wherein the first terminal of the second signal transistor is coupled to the second terminal of the first signal transistor;
a third signal transistor having a first terminal, a control terminal, and a second terminal, wherein the second terminal of the third signal transistor is coupled to the first terminal of the second signal transistor;
a buffer input;
a first bias circuit that AC couples the buffer input to the control terminal of the second signal transistor;
a second bias circuit that AC couples the second terminal of the second signal transistor to the control terminal of the third signal transistor; and
a buffer output that is coupled to the first terminal of the second signal transistor,
wherein the circuit is a buffer circuit, wherein the buffer circuit has an OP0.1 dB compression point power of at least −2.0 dBm at an operating frequency of at least six gigahertz, and also has an output impedance at the operating frequency of less than thirty ohms, and also has a bandwidth of at least three gigahertz.

10. A circuit comprising:
a first signal transistor having a first terminal, a control terminal, and a second terminal;
a current source having a first terminal and a second terminal, wherein the first terminal of the current source is coupled to the first terminal of the first signal transistor, and wherein the second terminal of the current source is coupled to the control terminal of the first signal transistor;
a second signal transistor having a first terminal, a control terminal, and a second terminal, wherein the second terminal of the second signal transistor is coupled to the second terminal of the current source, and wherein the first terminal of the second signal transistor is coupled to the second terminal of the first signal transistor;
a third signal transistor having a first terminal, a control terminal, and a second terminal, wherein the second terminal of the third signal transistor is coupled to the first terminal of the second signal transistor;
a first buffer input;
a first bias circuit that AC couples the first buffer input to the control terminal of the second signal transistor;
a second buffer input;
a second bias circuit that AC couples the second buffer input to the control terminal of the third signal transistor; and
a buffer output that is coupled to the first terminal of the second signal transistor.

11. The circuit of claim 10, wherein the current source is a field effect transistor, wherein the field effect transistor has a gate, and wherein there is substantially no AC signal present on the gate of the field effect transistor when the circuit is operating, and wherein the gate of the field effect transistor is neither AC coupled to the first buffer input nor to the second buffer input.

12. The circuit of claim 10, wherein the circuit is a buffer circuit, wherein the buffer circuit has an OP0.1 dB compression point power of at least −2.0 dBm at an operating frequency of at least six gigahertz, and also has an output impedance at the operating frequency of less than thirty ohms, and also has a bandwidth of at least three gigahertz.

13. A circuit comprising:
a first signal transistor having a first terminal, a control terminal, and a second terminal;
a second signal transistor having a first terminal, a control terminal, and a second terminal, wherein the second terminal of the second signal transistor is coupled to the control terminal of the first signal transistor, and wherein the first terminal of the second signal transistor is coupled to the second terminal of the first signal transistor;
a third signal transistor having a first terminal, a control terminal, and a second terminal, wherein the second terminal of the third signal transistor is coupled to the first terminal of the second signal transistor;
a fourth signal transistor having a first terminal, a control terminal, and a second terminal, wherein the second terminal of the fourth signal transistor is coupled to the second terminal of the second signal transistor, and wherein the first terminal of the fourth signal transistor is coupled to the first terminal of the first signal transistor;
a first buffer input;
a first bias circuit that AC couples the first buffer input to the control terminal of the second signal transistor;
a second buffer input;
a second bias circuit that AC couples the second buffer input to the control terminal of the third signal transistor;
a third bias circuit that AC couples the first buffer input to the control terminal of the fourth signal transistor; and
a buffer output that is coupled to the first terminal of the second signal transistor.

14. The circuit of claim 13, wherein the first bias circuit DC biases the second signal transistor to a first DC bias voltage, wherein the second bias circuit DC biases the third signal transistor to a second DC bias voltage, and wherein the third bias circuit DC biases the fourth signal transistor to a third DC bias voltage.

15. The circuit of claim 13,
wherein the first bias circuit comprises a first capacitor having a first plate and a second plate, wherein the first plate of the first capacitor is coupled to the first buffer input, and wherein the second plate of the first capacitor is coupled to the control terminal of the second signal transistor;
wherein the second bias circuit comprises a second capacitor having a first plate and a second plate, wherein the first plate of the second capacitor is coupled to the second buffer input, and wherein the second plate of the second capacitor is coupled to the control terminal of the third signal transistor; and
wherein the third bias circuit comprises a third capacitor having a first plate and a second plate, wherein the first plate of the third capacitor is coupled to the first buffer input, and wherein the second plate of the third capacitor is coupled to the control terminal of the fourth signal transistor.

16. The circuit of claim 15,
wherein the first bias circuit further comprises a first resistor that has a first terminal end and a second terminal end, wherein the first terminal end of the first resistor is coupled to the control terminal of the second signal transistor, and wherein a first bias voltage is present on the second terminal end of the first resistor;
wherein the second bias circuit further comprises a second resistor that has a first terminal end and a second terminal end, wherein the first terminal end of the second resistor is coupled to the control terminal of the third signal transistor, and wherein a second bias voltage is present on the second terminal end of the second resistor; and
wherein the first bias circuit further comprises a third resistor that has a first terminal end and a second terminal end, wherein the first terminal end of the third resistor is coupled to the control terminal of the fourth signal transistor, and wherein a third bias voltage is present on the second terminal end of the third resistor.

17. The circuit of claim 13, further comprising:
a receive chain comprising a Low Noise Amplifier (LNA), a mixer, and a base band filter, wherein the buffer output is coupled to inject a signal into the receive chain; and
a transmit chain comprising a base band filter, a mixer, and a Power Amplifier (PA), wherein a differential signal output by the PA is supplied in attenuated form onto the first and second buffer inputs.

18. The circuit of claim 13, wherein the circuit is a buffer circuit, wherein the buffer circuit has an OP0.1 dB compression point power of at least −2.0 dBm at an operating frequency of at least six gigahertz, and also has an output impedance at the operating frequency of less than thirty ohms, and also has a bandwidth of at least three gigahertz.

* * * * *